United States Patent
Sueoka et al.

(10) Patent No.: US 7,531,252 B2
(45) Date of Patent: May 12, 2009

(54) FILM AND MAGNETIC-RECORDING MEDIUM USING THE SAME

(75) Inventors: Masanori Sueoka, Otsu (JP); Akimitsu Tsukuda, Otsu (JP)

(73) Assignee: Toray Industries, Inc., Tokyo (JP)

( * ) Notice: Subject to any disclaimer, the term of this patent is extended or adjusted under 35 U.S.C. 154(b) by 352 days.

(21) Appl. No.: 10/578,921

(22) PCT Filed: Nov. 11, 2004

(86) PCT No.: PCT/JP2004/016726

§ 371 (c)(1), (2), (4) Date: May 9, 2006

(87) PCT Pub. No.: WO2005/046968

PCT Pub. Date: May 26, 2005

(65) Prior Publication Data

US 2007/0082232 A1   Apr. 12, 2007

(30) Foreign Application Priority Data

Nov. 14, 2003 (JP) ............................. 2003-384647

(51) Int. Cl.
*B32B 13/04* (2006.01)
*G11B 5/71* (2006.01)

(52) U.S. Cl. .................. 428/847; 428/458; 528/320

(58) Field of Classification Search ................ 428/141, 428/847, 847.1, 847.4, 847.8, 848.8, 458, 428/459; 528/310, 324; 360/131, 134, 135; 427/128

See application file for complete search history.

(56) References Cited

U.S. PATENT DOCUMENTS 4,645,702 A * 2/1987 Asakura et al. ............. 428/141
5,874,519 A * 2/1999 Nishimura et al. .......... 528/310

(Continued)

FOREIGN PATENT DOCUMENTS

JP    02-037519 A    2/1990
JP    02-084328 A    3/1990

(Continued)

*Primary Examiner*—Kevin M. Bernatz
*Assistant Examiner*—Louis Falasco
(74) *Attorney, Agent, or Firm*—Kubovcik & Kubovcik

(57) ABSTRACT

A film and a magnetic-recording medium using the film, where the heat shrinkage ratio in the transverse direction of the film subjected to heat treatment under no tension for 30 min. at 180° C. is from 1.0 to 2.5%, and where the film satisfies the following equations (1)-(4) simultaneously, with $\alpha MD$ ($\times 10^{-6}/°$ C.) and $\alpha TD$ ($\times 10^{-6}/°$ C.) being coefficient of thermal expansion in the longitudinal and the transverse direction, respectively, and $\beta MD$ ($\times 10^{-6}/\%$ RH) and $\beta TD$ ($\times 10^{-6}/\%$ RH) being coefficient of hygroscopic expansion in the longitudinal and the transverse direction, respectively. In the film, by controlling the dimensional changes by temperature and humidity within specific ranges, it becomes possible to control the dimensional change and the difference in dimensional changes between the longitudinal and the transverse direction of the film used as a magnetic-recording medium to be extremely small. $-10 \leq \alpha MD \leq 10$ (1), $\alpha MD - 10 \leq \alpha TD \leq \alpha MD - 3$ (2), $-10 \leq \beta MD \leq 10$ (3), $\beta MD - 10 \leq \beta TD \leq \beta MD - 3$ (4).

1 Claim, 1 Drawing Sheet

U.S. PATENT DOCUMENTS

| | | | |
|---|---|---|---|
| 6,376,043 B1 * | 4/2002 | Handa et al. | 428/141 |
| 6,797,381 B1 * | 9/2004 | Tsukuda et al. | 428/847.8 |
| 2001/0008714 A1 * | 7/2001 | Sueoka et al. | 428/847 |
| 2001/0055699 A1 * | 12/2001 | Kato et al. | 428/847 |
| 2002/0102351 A1 * | 8/2002 | Noguchi et al. | 427/128 |
| 2003/0235715 A1 * | 12/2003 | Ejiri et al. | 428/847 |

FOREIGN PATENT DOCUMENTS

| | | |
|---|---|---|
| JP | 02-112935 A | 4/1990 |
| JP | 03-060181 A | 3/1991 |
| JP | 06-136156 A | 5/1994 |
| JP | 06-180836 A | 6/1994 |
| JP | 07-223288 A | 8/1995 |
| JP | 08-297829 A | 11/1996 |
| JP | 09-169860 A | 6/1997 |
| JP | 2853036 B2 | 11/1998 |
| JP | 2952907 B2 | 7/1999 |
| JP | 11-279293 A | 10/1999 |
| JP | WO 00/18654 * | 4/2000 |
| JP | 2003-326401 A | 11/2000 |
| JP | 2001-294683 A | 10/2001 |
| JP | 2002-212318 A | 7/2002 |
| JP | 2003-160676 A | 6/2003 |
| WO | 00/18564 | 4/2000 |

* cited by examiner

FILM AND MAGNETIC-RECORDING MEDIUM USING THE SAME

TECHNICAL FIELD OF THE INVENTION

The present invention relates to a film, particularly, an aromatic polyamide film, and a magnetic-recording medium using it as a base film.

BACKGROUND OF THE INVENTION

By recent development of digital recording technology and remarkable increase of data treated by a computer, the demand of magnetic tapes for storing these data has been greatly increased. Although mainly polyester films have been used as base films of such magnetic tapes, recently, requirements for making magnetic tapes thinner and enabling them to record at a higher density have been increased, and therefore, aromatic polyamide films having excellent thermal resistance, mechanical property and dimensional stability have been frequently used.

Further, as described above, the data recording density of a magnetic-recording medium has been remarkably increased accompanying with the recent development to have a high capacity, and small dimensional changes tend to become causes of data missing. Such dimensional changes are classified into an irreversible change such as heat shrinkage and a reversible change such as expansion/shrinkage due to temperature or humidity. Although it is desired that the irreversible change does not exist, it can be removed in a processing process by a treatment such as annealing. On the other hand, because the reversible change can not be removed easily, if temperature or humidity changes when the film is preserved, an expansion or a shrinkage of the film occurs, and because the positions of recorded data are shifted from proper positions to be set, it may become difficult to read the data.

In aromatic polyamide films, examples for controlling the above-described changes due to temperature and humidity are disclosed in the following patent documents 1 to 6. However, these documents are all supposed to be applied to use for circuit boards such as flexible print circuit board and film connectors, and because the films are used at a condition being laminated mainly with copper, the films are designed so that the thermal expansion coefficient of copper and that of the films are adapted to each other.

On the other hand, examples supposing use as supporting materials for magnetic-recording media are disclosed in the following patent documents 7 and 8. Document 7 intends to make a dimensional change small by controlling coefficient of humidity expansion, discloses the necessity that the coefficient of hygroscopic expansion $\beta$ satisfies $\beta \leq 100 \times 10^{-6}$ (1/% RH), and discloses a film having $\beta$ of from 10 to $60 \times 10^{-6}$ (1/% RH) also in examples. However, it has been found that, if a magnetic layer and a backcoat layer are formed at a process for processing the film into a magnetic-recording medium, the dimensional change of the magnetic-recording medium and the dimensional change of the base film are different from each other by the influence of these layers. In such a case, the $\beta$ of the magnetic-recording medium frequently increases as compared with that of the base film, and in order to minimize the dimensional change of the magnetic-recording medium, sometimes it is preferred to design the $\beta$ of the base film to be minus. However, according to patent document 7, as described that "although the lower limit of $\beta$ is not particularly restricted, about $1 \times 10^{-6}$ is a limit for industrial production"(page 4, 18th paragraph), the concept and the technology for making the $\beta$ minus are not disclosed. Further, in a case where the magnetic layer is formed by vapor deposition, it is necessary to flatten a curled portion generating after forming the magnetic layer (a phenomenon that a tape is curved at a condition where the magnetic surface is positioned inside) by heat treatment, and at that time, the properties of the magnetic-recording medium in its transverse direction greatly change, and there occurs a difference in property between the longitudinal direction and the transverse direction. Although it is necessary to control the expansion coefficient of the base film so as to make a difference between that in the longitudinal direction and that in the transverse direction in order that the dimensional changes in the longitudinal and transverse directions of the magnetic-recording medium coincide with each other, such a concept is not disclosed. Further, although the following patent document 8 defines thermal expansion coefficient in the thickness direction for the purpose of improving slitting property, similarly to patent document 7 it does not disclose the concept to control so that the dimensional changes in the longitudinal and transverse directions after processing into the magnetic-recording medium coincide with each other.

Further, although the following patent document 9 discloses an example defining a hygroscopic expansion coefficient of a magnetic tape with a supporting material of an aromatic polyamide film, also it does not disclose the concept to control so that the dimensional changes in the longitudinal and transverse directions coincide with each other.

Patent document 1: JP-A-2-84328
Patent document 2: JP-A-2-112935
Patent document 3: JP-A-3-60181
Patent document 4: JP-A-6-136156
Patent document 5: Japanese Patent 2,853,036
Patent document 6: Japanese Patent 2,952,907
Patent document 7: JP-A-8-297829
Patent document 8: JP-A-2003-160676
Patent document 9: JP-A-6-180836

DISCLOSURE IF THE INVENTION

Problems to be Solved by the Invention

Accordingly, an object of the present invention is to solve the above-described conventional problems and to provide a film designed to suppress irreversible dimensional changes at the time of being formed as a magnetic-recording medium and to minimize the difference between the dimensional changes in the longitudinal and transverse directions, and a magnetic-recording medium using the film.

Means for Solving the Problems

To achieve the above objects, a film according to the present is characterized in that the heat shrinkage ratio in the transverse direction of the film subjected to heat treatment under a condition of no tension for 30 min. at 180° C. is from 1.0 to 2.5%, and the film satisfies the following equations (1)-(4) simultaneously, with $\alpha MD$ ($\times 10^{-6}$/° C.) and $\alpha TD$ ($\times 10^{-6}$/° C.) being coefficient of thermal expansion in the longitudinal and the transverse direction, respectively, and $\beta MD$ ($\times 10^{-6}$/% RH) and $\beta TD$ ($\times 10^{-6}$/% RH) being coefficient of hygroscopic expansion in the longitudinal and the transverse direction, respectively.

$$-10 \leq \alpha MD \leq 10 \quad (1)$$

$$\alpha MD - 10 \leq \alpha TD \leq \alpha MD - 3 \quad (2)$$

$$-10 \leq \beta MD \leq 10 \quad (3)$$

$$\beta MD - 10 \leq \beta TD \leq \beta MD - 3 \quad (4)$$

In this film, it is preferred that the film satisfies the following equations (5) and (6) simultaneously, with EMD (GPa) and ETD (GPa) being Young's moduli in the longitudinal and the transverse direction, respectively.

$$8 \leq EMD \leq 20 \quad (5)$$

$$EMD \times 0.7 \leq ETD \leq EMD \times 1.7 \quad (6)$$

Further, it is preferred that the polymer forming the film is an aromatic polyamide.

A magnetic-recording medium according to the present invention has a magnetic layer at least on one surface of the above-described film.

In this magnetic-recording medium, it is preferred that the magnetic-recording medium satisfies the following equations (7)-(10) simultaneously, with $\alpha'MD$ ($\times 10^{-6}$/° C.) and $\alpha'TD$ ($\times 10^{-6}$/° C.) being coefficient of thermal expansion in the longitudinal and the transverse direction, respectively, and $\beta'MD$ ($\times 10^{-6}$/% RH) and $\beta'TD$ ($\times 10^{-6}$/% RH) being coefficient of hygroscopic expansion in the longitudinal and the transverse direction, respectively.

$$-10 \leq \alpha'MD \leq 10 \quad (7)$$

$$-5 \leq \alpha'MD - \alpha'TD \leq 5 \quad (8)$$

$$-10 \leq \beta'MD \leq 10 \quad (9)$$

$$-5 \leq \beta'MD - \beta'TD \leq 5 \quad (10)$$

Effect According to the Invention

The following effects can be obtained in the present invention. In the film according to the present invention, by controlling the dimensional changes due to temperature and humidity in the specified ranges, it becomes possible to control the dimensional change and the difference in dimensional changes between the longitudinal and the transverse direction of the film used as a magnetic-recording medium to be extremely small. Therefore, in the magnetic-recording medium, even if the recording density is increased, necessary data can be properly read out.

THE BEST MODE FOR CARRYING OUT THE INVENTION

Figure 1:
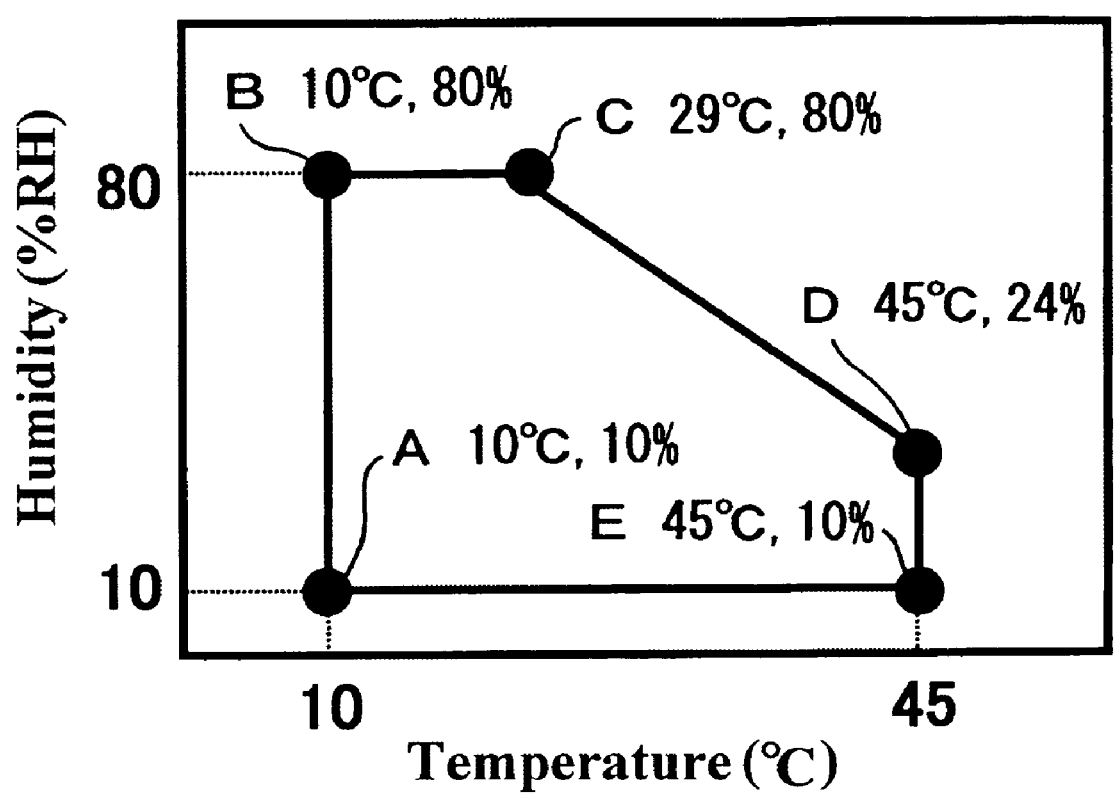
FIG. 1 is a diagram showing ranges of temperature and humidity conditions in a case where a film according to the present invention is actually used as a magnetic-recording medium.

In the film according to the present invention, the heat shrinkage ratio in the transverse direction of the film subjected to heat treatment under a condition of no tension for 30 min. at 180° C. is from 1.0 to 2.5%. If the heat shrinkage ratio in the transverse direction is less than 1.0%, there is a case where the effect for recovering a curl after processing into a magnetic-recording medium is not sufficient and the flatness of the film cannot be maintained. If the heat shrinkage ratio in the transverse direction is more than 2.5%, there is a case where a dimensional change due to heat shrinkage occurs even after the treatment for recovering a curl. It is preferred that the heat shrinkage ratio in the transverse direction is from 1.0 to 2.5% from the viewpoint of a good balance between the effect for recovering a curl and the dimensional change. Further, the heat shrinkage ratio in the longitudinal direction is preferably 1.5% or less, more preferably 1.0% or less, and this condition is preferred because a dimensional change of a tape due to temperature change becomes small. The measurement of the heat shrinkage ratio was performed so that a sample was cut at a width of 1 cm and a length of 22 cm, marks were provided at positions distanced by 1 cm from both ends in the lengthwise direction, the sample was subjected to heat treatment in a hot air oven at a temperature of 200° C. at a condition of no tension for 30 min., and the heat shrinkage ratio was calculated using the following equation (11).

Heat shrinkage ratio=((sample length before heat treatment−sample length after heat treatment)/ sample length before heat treatment)×100 (11)

The coefficient of thermal expansion factor in the longitudinal direction of the film according to the present invention $\alpha MD$ ($\times 10^{-6}$/° C.) is −10 or more and 10 or less. If the coefficient of is less than −10 or more than 10, the change due to thermal expansion or heat shrinkage is great, and there is a case where recorded data can not be read by alteration of environment when converted into a magnetic-recording medium. From the viewpoint of making a change due to heat smaller, the coefficient satisfies preferably $-7 \leq Amd \leq 7$, more preferably $-5 \leq \alpha MD \leq 5$. Further, the above-described treatment for flattening a curl generated after forming a magnetic layer is performed mainly by heating it at about 150-250° C. at a condition applying a tension in the longitudinal direction, thereby contracting the base film in the transverse direction. Thus, although the behavior due to heat in the longitudinal direction does not change greatly, it has been clear that in the transverse direction the coefficient of thermal expansion becomes greater by 3-10. Therefore, in order to design so as to approach the difference between thermal changes in the longitudinal and transverse directions of the magnetic-recording medium to zero, it is preferred to subtract the above-described amount of elevation with respect to base film and to design so that $\alpha MD-10 \leq \alpha TD \leq \alpha MD-3$ (equation (2)) is satisfied. If $\alpha MD-3 < \alpha TD$ or $\alpha TD < \alpha MD-10$, there is a case where the rates of the dimensional changes in the longitudinal and transverse directions, due to heat when converted into a magnetic-recording medium, are greatly different from each other. If such a film is used as a base film, particularly in a case where a magnetic head is helical scanning type head, because the angle of the head relative to the magnetic tape (the magnetic-recording medium) is fixed, there is a case where the head cannot follow the shift in the data writing direction due to the difference between the dimensional changes in the longitudinal and transverse directions. From the viewpoint of making the rates of the dimensional changes in the longitudinal and transverse directions, due to heat when converted into a magnetic-recording medium, to be more even, $\alpha MD-6 \leq \alpha TD \leq \alpha MD-4$ is more preferable. Where, the coefficient of thermal expansion α was determined by using a thermal machine analyzer (TMA), and calculating it from a displacement of 30° C.→40° C. (: a region where the magnetic-recording medium is actually used) using the following equation (12).

$$\alpha = (X1-X0)/(\text{temperature difference} \times \text{sample length before measurement}) \quad (12)$$

X0: sample length at 30° C. (mm)
X1: sample length at 40° C. (mm)

Further, in the film according to the present invention, the coefficient of hygroscopic expansion in the longitudinal direction $\beta MD$ ($\times 10^{-6}$/% RH) is −10 or more and 10 or less. If the coefficient is less than −10 or more than 10, the change due to the expansion or the shrinkage due to humidity is great, and there is a case where recorded data cannot be read by alteration of environment when converted into a magnetic-recording medium. From the viewpoint of making a change due to humidity smaller, the coefficient satisfies preferably $-7 \leq \beta MD \leq 7$, more preferably $-5 \leq \beta MD \leq 5$. Further, similarly to in thermal expansion, although the behavior due to humidity in the longitudinal direction does not change greatly at the time of the treatment for flattening a curl, it has been clear that in the transverse direction the humidity expansion factor becomes greater by 3-10. Therefore, in order to design so as to approach the difference between the changes due to humidity in the longitudinal and transverse directions of the magnetic-recording medium to zero, it is preferred to subtract the above-described amount of elevation with respect to base film and to design so that $\beta MD-10 \leq \beta TD \leq \beta MD-3$ (equation (4)) is satisfied. If $\beta MD-3 < \beta TD$ or $\beta TD < \beta MD-10$, there is a case where the rates of the dimensional changes in the longitudinal and transverse directions, due to humidity when converted into a magnetic-recording medium, are greatly different from each other. In such a film, similarly to in the case of thermal expansion, there is a case where the head cannot follow the shift in the data writing direction due to the difference between the dimensional changes in the longitudinal and transverse directions. From the viewpoint of making the rates of the dimensional changes in the longitudinal and transverse directions, due to humidity when converted into a magnetic-recording medium, to be more even, $\beta MD-6 \leq \beta TD \leq \beta MD-4$ is more preferable. Where, the humidity expansion factor β was determined by using a tape elongation tester, and calculating it from a displacement when the atmosphere is changed from 25° C., 25% RH to 25° C., 85% RH by using the following equation (13).

$$\beta=(Y1-Y0)/(\text{humidity difference} \times \text{sample length before measurement}) \quad (13)$$

Y0: length of a sample left for 24 hours at 25° C., 25% RH (mm)

Y1: length of a sample left for 24 hours at 25° C., 85% RH (mm)

These equations (1)-(4) have to be satisfied simultaneously, and if any one equation is not satisfied, there is a case where data cannot be read by the dimensional change when converted into a magnetic-recording medium.

Further, in the present invention, a magnetic-recording medium can be made by providing a magnetic layer to at least one surface of the above-described film. In this case, it is preferred that the magnetic-recording medium satisfies the following equations (7)-(10) simultaneously, with α'MD and α'TD ($\times 10^{-6}/°$ C.) being coefficient of thermal expansion in the longitudinal and the transverse direction, respectively, and β'MD and β'TD ($\times 10^{-6}/\%$ RH) being coefficient of hygroscopic expansion factors in the longitudinal and the transverse direction, respectively.

$$-10 \leq \alpha'MD \leq 10 \quad (7)$$

$$-5 \leq \alpha'MD - \alpha'TD \leq 5 \quad (8)$$

$$-10 \leq \beta'MD \leq 10 \quad (9)$$

$$-5 \leq \beta'MD - \beta'TD \leq 5 \quad (10)$$

By satisfying equations (7) and (9), the absolute values of the dimensional changes due to temperature and humidity can be made small, respectively, and by satisfying equations (8) and (10), the difference between the dimensional changes in the longitudinal and transverse directions can be made small. If the absolute value of the dimensional change is large, when processed into a magnetic tape and the like, there is a case where data cannot be read by a shift of the position of recorded data, or a local protrusion or a winding shift in a wound roll occurs when used as a wound roll. If there is a difference between the dimensional changes in the longitudinal and transverse directions, as described above, there is a case where a head cannot follow a shift in the data writing direction and the data cannot be read.

Further, it is preferred that the film according to the present invention satisfies the following equations (5) and (6) simultaneously, with EMD and ETD (GPa) being Young's moduli in the longitudinal and the transverse direction, respectively.

$$8 \leq EMD \leq 20 \quad (5)$$

$$EMD \times 0.7 \leq ETD \leq EMD \times 1.7 \quad (6)$$

If EMD is less than 8 GPa, there is a case where the stiffness is insufficient and it does not adapt for thinning a film. From the viewpoint of being more adaptable for film thinning, more preferably EMD is 10 GPa or more, and further preferably, 12 GPa or more. The higher EMD is, the more adaptable for film thinning, but, if it is too high, because the elongation decreases and the film becomes fragile, the upper limit is preferably 20 GPa. Further, if EMD×0.7>ETD, there is a case where the film is oriented too much in the longitudinal direction and it is likely to be easily torn, or the Young's modulus in the transverse direction is insufficient, and when the tape runs repeatedly, the tape is deformed and the magnetic property thereof changes. Further, if ETD>EMD×1.7, there is a case where the film is oriented too much in the transverse direction and the slitting property deteriorates, or when the film runs repeatedly, the end thereof is deformed. For achieving a better slitting property and a better balance of Young's moduli, preferably EMD×0.8≤ETD≤EMD×1.6 is satisfied, and more preferably EMD×1.0≤ETD≤EMD×1.5 is satisfied. Where, the Young's modulus was determined by stretching the film at a tensile speed of 300 mm/min. using "Tensilon" (a tensile tester) and calculating it from the initial gradient of a curve indicated by elongation and stretching stress.

Further, it is preferred that the elongation of the film according to the present invention is 5% or more in all directions. If the elongation is less than 5%, there is a case where the film becomes fragile and it is easily cut. Because an appropriate flexibility can be given when processed into a tape, the elongation is preferably 10% or more, and more preferably 20% or more.

The moisture absorption ratio of the film according to the present invention is preferably 5% or less, more preferably 3% or less, further preferably 2% or less, because the dimensional change due to humidity change can be appropriately suppressed.

In the above-described film according to the present invention, the polymer forming the film is preferably an aromatic polyamide, thereby satisfying various properties.

Where, as the aromatic polyamide, for example, preferably employed are polyamides having repeated units represented by the following chemical formula (1) and/or chemical formula (2).

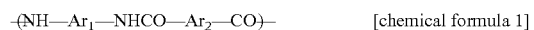 [chemical formula 1]

 [chemical formula 2]

Where, as the groups of $Ar_1$, $Ar_2$ and $Ar_3$, for example, the groups represented by the following chemical formulae (3) can be raised.

[chemical formula 3]

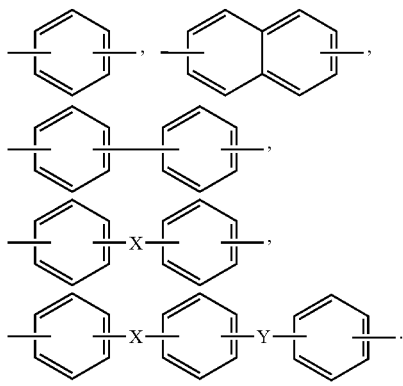

Although the above-described groups X and Y are selected from —O—, —CH$_2$—, —CO—, —CO$_2$—, —S—, —SO$_2$—, —C(CH$_3$)$_2$— and the like, they are not limited thereto.

Further, it is preferred that a part of hydrogen atoms on these aromatic rings is substituted by a halogen group such as fluorine, bromine or chlorine (especially, chlorine), a nitro group, an alkyl group such as methyl or ethyl (especially, methyl group), an alkoxy group such as methoxy, ethoxy or propoxy, because the moisture absorption ratio is reduced and the dimensional change due to humidity change becomes small. Further, hydrogen in an amide bond forming the polymer may be substituted by another substituent.

In the aromatic polyamide used in the present invention, it is preferred that 80 mol % or more, more preferably 90 mol % or more of all aromatic rings are aromatic rings having a para orientation of the above-described aromatic rings. In this case, the "para orientation" means a state in that divalent bonds forming a main chain on an aromatic ring are coaxial parallel to each other, If the aromatic rings having this para orientation are less than 80 mol %, there is a case where the stiffness and thermal resistance of the film become poor. Moreover, it is preferred that the aromatic polyamide contains the repeated unit represented by the following chemical formula (4) at a content of 60 mol % or more, because the stretching property and the film properties are particularly excellent.

[chemical formula 4]

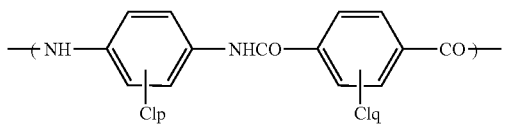

(Where, "p" and "q" are integers of from 0 to 4.)

In a case where the aromatic polyamide used in the present invention is prepared from aromatic di-acidic chloride and aromatic diamine, it is preferred that they are synthesized by solution polymerization in a non-protic organic-polarity solvent such as N-methyl-2-pyrolidone, dimethylacetamide or dimethylformamide.

At that time, in order to suppress generation of low-molecular substances, mixture of water and other substances obstructing the reaction should be avoided, and an efficient mixing means is preferably employed. Further, as the dissolution assistant, calcium chloride, magnesium chloride, lithium chloride, lithium bromide, lithium nitrate and the like may be added.

Although hydrogen chloride is generated as by-product when aromatic di-acidic chloride and aromatic diamine are used as monomers, in order to neutralize this, an inorganic neutralizer represented by a salt comprising a cation of first or second group of the periodic table and an anion such as hydroxide ion or carbonate ion, or an organic neutralizer such as ethylene oxide, propylene oxide, ammonia, triethylamine, triethanolamine, diethanolamine and the like, may be used. Further, for the purpose of improving the humidity properties of the base film, benzoyl chloride, phthalic anhydride, acetic chloride, aniline and the like may be added to the system completing the polymerization, thereby enclosing the functional end groups of the polymer.

In order to obtain the film according to the present invention, it is preferred that the intrinsic viscosity of the polymer (a value determined by preparing a solution of 100 ml by adding the polymer of 0.5 g in sulphuric acid and measuring at 30° C. is 0.5 or more.

As the raw solution for film forming, the polymer solution after neutralization may be used as it is, or a polymer solution re-dissolved into a solvent after the polymer is once isolated may be used. As the solvent, although an organic-polarity solvent such as N-methyl-2-pyrolidone, dimethylacetamide or dimethylformamide is preferable from the viewpoint of easy handling, a strong acidic solvent such as concentrated sulphuric acid, concentrated nitric acid or polyphosphoric acid may be used. The concentration of the polymer in the raw solution for film forming is preferably in a range of 2-20 wt %.

Further, for aromatic polyamide forming a surface layer, it is preferred that lubricant, antioxidant or other additives are blended at a content which does not damage the film properties.

Further, it is preferred that particles exist in the film for the purpose of giving an appropriate roughness to the film. As the kind of the particles, although there are inorganic particles such as SiO$_2$, TiO$_2$, Al$_2$O$_3$, CaSO$_4$, BaSO$_4$, CaCO$_3$, carbon black, zeolite or other metal fine powder, and organic polymer particles such as silicone particles, polyimide particles, crosslinked copolymer particles, crosslinked polyester particles, crosslinked polystyrene particles or Teflon (registered trade mark) particles, from the viewpoint of making the most of the thermal resistance of the aromatic polyamide film, inorganic particles excellent in thermal resistance are more preferable. As the particle diameter, although there is a range for selection depending on use, it is preferably in a range of 0.01-2 μm, more preferably in a range of 0.05-1 μm. As the content thereof, in order to obtain a good slipping property of the film surface, it is preferably in a range of 0.01-10 wt %, more preferably in a range of 0.1-5 wt %. For example, in a case where the film is used for a magnetic-recording medium, it is preferred that inorganic particles having a mean particle diameter in a range of 0.01-0.51 μm are contained at a content in a range of 0.1-3 wt % from the viewpoint of satisfying all the electromagnetic conversion property and the running ability and the durability. If the slipping property of the film surface is not appropriate, when the film is brought into contact with a roller in the film forming process and a film processing process, it is likely to become a cause of scratches even if there are fine foreign materials. Although the surface roughness of a final film should be appropriately designed depending on use similarly to contained particles, for example, in a case where the film is used for a magnetic-recording medium, the surface roughness is preferably in a range of 0.1-100 nm, more preferably in a range of 0.2-50 nm as center line average roughness Ra, and preferably in a range of 2-500 nm, more preferably in a range of 3-400 nm as ten-point average roughness Rz, because the film is hardly scratched.

The raw solution for film forming thus prepared is formed into a film by a dry process, a dry-wet process, a wet process and the like, and the dry-wet process is preferable because a high-quality film can be obtained.

Hereinafter, it will be explained by taking the dry-wet process as an example.

The above-described raw solution for film forming is extruded from a die onto a supporting material such as a drum or an endless belt to form a thin membrane, then a solvent is evaporated from the thin membrane layer, and a polymer sheet capable of being peeled off from the supporting material is obtained. Where, the "polymer sheet" means a film or sheet having a self-supporting property which contains a solvent, a dissolution assistant and the like except the polymer.

The temperature for drying of this case (the temperature of the supporting material and the hot air) is preferably in a range of 80-200° C. because a good flatness of the film surface can be obtained. Moreover, it is preferred that, after preheating at 80-120° C., the temperature for drying is elevated at a temperature of 120-200° C., because the flatness becomes better and the time for drying can be shortened.

Further, it is preferred that the content of the solvent in the polymer sheet is in a range of 20-70 wt %. If the content of the solvent is more than 70 wt %, the self-supporting property of the polymer sheet is insufficient and the stretching property is likely to become uneven, and if less than 20 wt %, there is a case where the polymer is precipitated partially and the elongation of the film decreases. If the stretching property is thus uneven, unevenness in film thickness or behavior of dimensional change is liable to occur. Because the film thickness and the behavior of dimensional change become more uniform, the content of the solvent in the polymer sheet is more preferably in a range of 30-70 wt %, and further preferably in a range of 30-60 wt %. Further, the temperature of the polymer sheet at the time of being peeled off from the supporting material is preferably in a range of 80-120° C. If the temperature is higher than 120° C., the polymer sheet is softened and unevenness in thickness or behavior of dimensional change is liable to occur, and a difference between the behaviors of dimensional changes in the longitudinal and transverse directions is generated. If the temperature is lower than 80° C., there is a case where the drying time becomes longer and the productivity reduces. In order to control the temperature of the polymer sheet as described above, it is preferred to control the temperature for drying at a low temperature (80-120° C.) in the initial period, at a high temperature (120-200° C.) in the middle period, and again at a low temperature (80-120° C.) in the late period (at the time of being peeled off). The supporting material is preferably an endless belt because the temperature for drying in each process can be controlled easily.

The polymer sheet thus delaminated from the supporting material is stretched in the longitudinal direction at a draw ratio of 1.1-2.0 times after being cooled at a temperature of 30-60° C. For the cooling, the sheet may be brought into contact with a roller through which a cold water is supplied, or cold air may be used therefor. If the temperature of the polymer sheet is higher than 60° C., there is a case where a difference between the behaviors of dimensional changes in the longitudinal and transverse directions is generated, or because a temperature of polymer sheet is far different from that of the wet process, there occurs a great neck down in the sheet at the time being introduced into the wet process, and the heat shrinkage ratio in the transverse direction becomes smaller or the difference between the behaviors of dimensional changes in the longitudinal and transverse directions becomes further great. If lower than 30° C., the polymer sheet does not have a flexibility, there is a case where the polymer sheet is broken at the time of stretching, and such a condition is not preferable. Further, if the draw ratio is less than 1.1 times, there is a case where the Young's modulus in the longitudinal direction becomes less than 7 GPa. If the draw ratio is more than 2.0 times, the film is likely to be torn.

Then, the polymer sheet having completed the stretching process in the longitudinal direction is introduced a wet process, and subjected to demineralization and removal of solvent. If heat treatment is performed as it is without passing through the wet process, there is a case where the surface is greatly roughened or a curl is generated. The temperature of the wet bath is preferably in a range of 30-60° C. If higher than 60° C., there is a case where the surface is roughened, and if lower than 30° C., there is a case where the time for demineralization and removal of solvent becomes long.

The film having passed through the wet process is subjected to drying of moisture and heat treatment. The temperature for the heat treatment is preferably in a range of 200-400° C., more preferably in a range of 240-320° C. If the temperature for the heat treatment is lower than 200° C., there is a case where the Young's modulus of the film reduces, and if higher than 400° C., there is a case where the crystallization of the film proceeds too much and the film becomes hard and fragile.

Further, the stretching in the transverse direction is performed at the time of the heat treatment. The draw ratio is preferably set so that the following equation is satisfied with RMD being a draw ratio in the longitudinal direction and RTD being a draw ratio in the transverse direction, in order that EMD and ETD satisfy the relationship of equation (6).

$$RMD \times 0.6 \leqq RTD \leqq RMD \times 1.8$$

Next, it is preferred that the film is stretched again in the transverse direction at a temperature of 150-250° C. and a draw ratio of 1.01-1.03 times, thereafter heat treated at a temperature of 150-250° C. for 30 min. or more under a condition being kept at a constant length in the transverse direction, and heat set. By this operation, a heat shrinkage ratio in the transverse direction necessary for recovering a curl can be given. Further, by combining the temperature control at the drying process and this heat treatment, the coefficient of thermal expansion and the coefficient of hygroscopic expansion of the film in the transverse direction can be made smaller by from 3 to 10 relative to those in the longitudinal direction (equations (2) and (4) can be satisfied), and the difference between dimensional changes in the longitudinal and transverse directions when converted into a magnetic-recording medium can be decreased. If the temperature for the restretching is higher than 250° C., the necessary heat shrinkage ratio cannot be obtained and there is a case where the curl recovery becomes insufficient, and if lower than 150° C., there is a case where the stretching stress becomes large and the dimensional change increases. If the draw ratio for the restretching is more than 1.03 times, the heat shrinkage ratio becomes too large, and if less than 1.01 times, the necessary heat shrinkage ratio cannot be obtained and there is a case where the curl recovery becomes insufficient. Further, in a case where the heat setting is not performed, there is a case where the advantage due to the restretching is lost by the heat received by the film at the time of forming a magnetic layer. The temperature for the heat setting is set preferably at a temperature lower than the temperature for the restretching by 30-50° C., because the difference between the dimensional changes in the longitudinal and transverse directions after the curl treatment can be made smaller.

The film produced in the present invention may be a laminated film. For example, in a case of two-layer film, polymerized aromatic polyamide solution is divided into two parts, and different particles and the like are added to the respective divided solutions and thereafter they are laminated. In cases of three layers or more, it is similar. As the method of these laminations, there are known methods such as lamination in a die, lamination in a pipe, and a method for once forming a single layer and laminating another layer thereon.

Although the film according to the present invention can be applied also for use of flexible printed circuit boards, thermosensitive transfer ribbons, capacitors and the like, it is particularly useful as a base film for magnetic-recording media, and in a case where it is used as a base film for magnetic-recording media, it is converted into a magnetic-recording medium by providing a magnetic layer onto one surface or each surface.

As preferable uses of magnetic-recording media, for example, there are a public or professional use such as digital video cassette, a use for broadcasting station such as so-called D-1, 2 or 3, a use for data storage such as so-called DDS-2, 3 or 4, QIC, data 8 mm, or DLT, and in particular, it can be used suitably for use for data storage in which a reliability such as preventing data lack is attached importance.

In the magnetic-recording medium according to the present invention, it is preferred that the thickness of the base film is in a range of 1-5 μm and the thickness when converted into a magnetic-recording medium is in a range of 2-8 μm, because a large volume recording capacity can be obtained while desired magnetic property and the running ability as a magnetic-recording property can be maintained.

In the magnetic-recording medium according to the present invention, as the method for forming a magnetic layer, application method, deposition method, ion plating method, sputtering method, cluster ion beam method and the like can be raised, and in particular, use of deposition method is preferable because the advantages according to the present invention can be sufficiently exhibited.

In the deposition method, for example, a thin metal membrane can be used which is formed by oblique deposition or perpendicular deposition and which comprises mainly Co, Ni, Fe and the like or an alloy thereof. For example, a ferromagnetic metal such as Co, Ni or Fe or a ferromagnetic alloy such as FE—Co, Co—Ni, Fe—Co—Ni, Fe—Cu, Co—Au, Co—Pt, Mn—Bi, Mn—Al, Fe—Cr, Co—Cr, Ni—Cr, Fe—Co—Cr, Co—Ni—Cr or Fe—Co—Ni—Cr, can be raised. These may be either a single-layer membrane or a multi-layer membrane.

Further, as the method of deposition, although a vacuum deposition method for heating and evaporating a ferromagnetic material under a pressure-reduced condition is preferable, a so-called PVD technology may be used such as ion plating method for performing evaporation of a ferromagnetic material in a discharge condition, or sputtering method for generating a glow discharge in an atmosphere main component of which is argon and kicking out atoms on a target surface by the generated argon ions. After forming the magnetic thin membrane, preferably a heat treatment at 150-250° C. is performed as curl treatment. At that time, it is preferred to apply a tension of 0.5-10 MPa in the longitudinal direction. Further, for the purpose of enhancing the durability or the weatherproof property of the magnetic-recording medium, as needed, a hard carbon layer may be provided to the surface of the magnetic layer formed by a metal magnetic thin membrane by sputtering method or CVD method, and further, it is possible to further enhance the running ability, which is based on the shape of the particle-like protrusions of the magnetic material, by providing a lubricant layer. As the lubricant, for example, a fatty acid and a fatty acid ester can be raised.

It is preferred that a backcoat layer is provided on the other side of the base film of the magnetic-recording medium according to the present invention. It is preferred that this backcoat layer is formed basically from non-magnetic powder and binder, and carbon black is contained as the non-magnetic powder. Moreover, it is preferred that calcium carbonate and inorganic powder with a Moh's hardness of 5-9 are contained as inorganic powder.

EXAMPLES

Hereinafter, examples of the present invention will be explained.

The determination of the properties and the estimation of the effects in the following examples were performed by the following methods.

(1) Temperature of Polymer Sheet:

It was measured at a central portion in the transverse direction, using a contact-type thermometer SK-2000MC produced by Satoh Meter Corporation.

(2) Heat Shrinkage Ratio (%):

The aromatic polyamide film was cut at a width of 1 cm and a length of 22 cm to make a sample, and marks were provided at positions distanced by 1 cm from both ends of the sample in the lengthwise direction. The sample was subjected to heat treatment in a hot air oven at a temperature of 200° C. at a condition of substantially no tension for 30 min., and the heat shrinkage ratio was calculated using the following equation (11). The measurement was repeated five times, and the average value was determined.

$$\text{Heat shrinkage ratio} = ((\text{sample length before heat treatment} - \text{sample length after heat treatment})/\text{sample length before heat treatment}) \times 100 \quad (11)$$

(3) Young's Modulus E:

It was determined at a condition of 25° C. and 60% RH, using a robot Tensilon RTA-100 (produced by Orientec Corporation). A sample was set at a width of 10 mm and a length between chucks of 50 mm, the measurement was carried out at a stretching speed of 300 mm/min., and the measurement was repeated five times and the average value was determined.

(4) Coefficient of Thermal Expansion α:

A cut piece (a sample) with a width of 4 mm and a length of 15 mm was cut away from the film, using the following device, the temperature was changed at an order of 20° C.→50° C.→20° C.→50° C. at a temperature elevation speed·temperature lowering speed of 1° C./min. under a condition of nitrogen atmosphere, and it was calculated from a displacement amount of 30° C.→40° C. at the time of temperature re-elevation, using the following equation (12). The loaded weight was 5 g. The measurement was repeated three times, and the average value was determined. As to the direction (MD, TD), the determination was carried out so that the sample length in the measurement direction was set at 15 mm.

Device: thermal machine tester, produced by Shinku Rikoh Corporation

TM-9400: balance portion and heating furnace

MTS-9000: multi-thermal analysis station $$\alpha = (X1 - X0)/(\text{temperature difference} \times \text{sample length before measurement}) \quad (12)$$

X0: sample length at 30° C. (mm)

X1: sample length at 40° C. (mm)

temperature difference=10 (° C.)
sample length before measurement=15 (mm)

(5) Coefficient of Hygroscopic Expansion β:

A cut piece (a sample) with a width of 10 mm and a length of 200 mm was cut away from the film, the sample was served to a tape elongation tester 1TTM1, produced by Ohkura Industry Corporation, placed in a thermo-hygrostat LH20-14, produced by Nagano Kagaku Kikai Seisakusyo Corporation, an amount of change was determined at the following condition, and the coefficient was calculated using the following equation (13). The loaded weight was 10 g. The measurement was repeated two times, and the average value was determined. As to the direction (MD, TD), the determination was carried out so that the sample length in the measurement direction was set at 200 mm. Condition:

(a) The sample was left for 24 hours at 25° C. and 25% RH.
(b) The humidity was changed to 85% RH taking a time of 150 min., from the condition of 25° C. and 25% RH.
(c) The sample was left for 24 hours at 25° C. and 85% RH.

$$\beta=(Y1-Y0)/(\text{humidity difference} \times \text{sample length before measurement}) \quad (13)$$

Y0: sample length after leaving for 24 hours at 25° C. and 25% RH (mm)
Y1: sample length after leaving for 24 hours at 25° C. and 85% RH (mm)
humidity difference: 60 (% RH)
sample length before measurement=200 (mm)

(6) Determination of Curl Recovering:

Five samples, each having a width of 1 cm and a length of 10 cm, were cut away from a magnetic tape at intervals of 10 m, they were placed on a horizontal table, the heights of the portions each having a maximum deformation from the horizontal surface were measured, and the average value was determined. The estimation was performed along the following standard. The rank "Δ" or higher is within the range of practical use. In the rank "X", because a precise measurement cannot be performed on account of the influence of curl, the measurement of dimensional change is not carried out.

○: Deformation amount is less than 1 mm.
Δ: Deformation amount is 1-2 mm.
X: Deformation amount is more than 2 mm.

(7) Determination and Estimation of Dimensional Change:

A cut piece (a sample) with a width of 10 mm and a length of 200 mm was cut away from the film, the sample was served to a tape elongation tester 1TTM1, produced by Ohkura Industry Corporation, placed in a thermo-hygrostat LH20-14, produced by Nagano Kagaku Kikai Seisakusho Corporation, an amount of change was determined at the following condition. The loaded weight was 10 g.

Condition:

The temperature/humidity condition actually used as a magnetic-recording medium is within the pentagonal region shown in FIG. 1. In this region, the changes of following Conditions 1-3 have great influences given to the dimension of the magnetic-recording medium. Therefore, the temperature and the humidity were changed at these three Conditions by the following operations (a) to (c), and the dimensional change was determined.

|  | Initial state | State after change |
|---|---|---|
| Condition 1: | A: 10° C., 10% RH → | C: 29° C., 80% RH |
| Condition 2: | A: 10° C., 10% RH → | D: 45° C., 24% RH |
| Condition 3: | E: 45° C., 10% RH → | B: 10° C., 80% RH |

(a) left at the initial state for 24 hours
(b) changed from the initial state to the state after change taking 150 min.
(c) left at the state after change for 24 hours Measurements of Conditions 1-3 were carried out, and the dimensional changes were calculated, respectively, using the following equation (14). The measurement was repeated two times, and the average value was determined.

$$\text{Dimensional change (\%)}=(Y1-Y0)\times 100/(\text{sample length before measurement}) \quad (14)$$

Y0: sample length after being left for 24 hours at the initial state (mm)
Y1: sample length after being left for 24 hours at the state after change (mm)

The estimation was carried out along the following standard, and the rank "Δ" or higher is within the range of practical use.

○: Any change amount in MD and TD is less than 0.07% and the difference therebetween is less than 0.02
Δ: Any change amount in MD and TD is less than 0.07% and the difference therebetween is 0.02 or more and less than 0.03
X: Either change in MD or change in TD is 0.07% or more, or the difference therebetween is 0.03 or more.

(8) Deformation of End Portion:

After the magnetic tape made by the method described in Example was run at a running speed of 0.2 m/sec. for 50 hours by using a DDS2 drive, the end portion of the tape was observed. Five samples with a length of 10 cm were cut away at intervals of 10 m, they were placed on a horizontal table, the heights of the portions each having a maximum deformation from the horizontal surface were measured, and the average value was determined. The estimation was performed along the following standard, and the rank "Δ" or higher is within the range of practical use.

○: Deformation amount is less than 1 mm.
Δ: Deformation amount is 1-2 mm.
X: Deformation amount is more than 2 mm.

(9) Running Durability:

At a condition of TM1 defined in ECMA standard using a DDS2 drive, the estimation of 10,000 P(pass) was carried out. It was estimated by the pass times at which a running stop due to elevation of error rate occurred. The rank "Δ" or higher is within the range of practical use.

○: non-stop up to 10,000 P
Δ: stop at 5,000-10,000 P
X: stop at a pass of 5,000 P or less Hereinafter, the present invention will be explained in more detail based on Examples, but the present invention is not limited thereto. Further, "part" described in the following Examples indicates "part by weight".

Example 1

(Preparation of Polymer Raw Solution)

85 mol % 2-chloroparaphenylenediamine and 15 mol % 4,4'-diaminodiphenylether were dissolved to dehydrated N-methyl-2-pyrolidone, 98.5 mol % 2-chloroterephthalic chloride was added thereto, and after polymerization by stirring for two hours, neutralization was carried out by lithium carbonate to prepare an aromatic polyamide solution whose polymer concentration was 11 wt %.

(Production of Aromatic Polyamide Film)

This polymer raw solution was cast from a die with a width of 830 mm onto a stainless belt having a mirror surface and rotating at a speed of 8.0 m/min. so that the thickness of a final film became 4 μm. The cast polymer solution was heated by hot air initially at 100° C. (initial temperature) then at 180° C. (middle period temperature) respectively for 1 min. to evaporate the solvent, and thereafter, hot air of 100° C. (late period temperature) was blown for 30 seconds., and after cooling the temperature of the polymer sheet down to 120° C., the sheet was peeled off. Further, after cooling the temperature of the polymer sheet down to 60° C. by using a cooling roller with a temperature of 50° C., the sheet was stretched in the longitudinal direction at a draw ratio of 1.15 times. Next, the sheet was passed into a water bath with a temperature of 50° C. for 2 minutes to extract by water the residual solvent and inorganic salt generated by the neutralization. Thereafter, stretching of 1.44 times in TD (transverse direction) and heat treatment were carried out at a temperature of 280° C. in a tenter. Further, after restretching in the transverse direction was carried out at a temperature of 200° C. and a draw ratio of 1.015 times, heat setting was carried out at 150° C. for 45 seconds.

(Making of Magnetic-Recording Medium (Magnetic Tape)):

A continuous winding type deposition apparatus was exhausted so that the inside became a pressure-reduced condition of about $10 \times 10^{-3}$ Pa, and a base film was set thereto. A magnetic layer formed with a ferromagnetic metal thin membrane of Co was formed on the surface of the base film in an atmosphere with a fine amount of oxygen by continuous oblique vacuum deposition. The condition of the deposition was set at an incident angle for oblique deposition of 45 degrees from the normal line of the base film and a film feeding speed of 50 m/min., and the intensity of the electron beam was adjusted so that the deposition thickness became 0.2 μm. Next, after a magnetron sputtering apparatus was reduced in pressure so that the inside thereof became about $10 \times 10^{-4}$ Pa, Ar gas was introduced, and the inside pressure was controlled at about 0.8 Pa. Then, a film formed with a magnetic layer of a ferromagnetic metal thin membrane was set to this magnetron sputtering apparatus, the film was run on a cooling can cooled at −40° C. at a feeding speed of 5 m/min., and a carbon protection membrane was formed on the magnetic layer. Next, a backcoat layer having the following composition was applied to the surface of the base film opposite to the surface formed with the magnetic layer so that the thickness after drying became 0.5 μm.

(Components for Forming Backcoat Layer)

| | |
|---|---|
| fine particle-like carbon black powder (produced by Cabot Corporation, BP-800, mean particle size: 17 mμ) | 100 parts |
| large particle-like carbon black powder (produced by Karn Karub Corporation, "Thermal black", mean particle size: 270 mμ) | 10 parts |
| calcium carbonate (produced by Shiraishi Kogyo Corporation, "Hakuenka O", mean particle size: 40 mμ) | 80 parts |
| α-alumina (produced by Sumitomo Kagaku Kogyo Corporation, HIT55, mean particle size: 200 mμ, Moh's hardness: 8.5) | 5 parts |
| nitrocellulose resin | 140 parts |
| polyurethane resin | 15 parts |
| polyisocyanate resin | 40 parts |
| polyester resin | 5 parts |
| dispersant: oleic copper | 5 parts |
| copper phthalocyanine | 5 parts |
| barium sulfate | 5 parts |
| methylethylketone | 2200 parts |
| butyl acetate | 300 parts |
| toluene | 600 parts |

After the respective components forming the above-described backcoat layer were kneaded by a continuous kneader, they were dispersed by using a sand mill. The dispersed solution obtained was filtrated by using a filter with a mean pore diameter of 1 μm, and the coating solution for forming the backcoat layer was thus prepared and it was used.

Further, after a topcoat layer of lubricant comprising perfluoropolyether was formed on the carbon protection membrane, while adjusting so that a tension of 2 MPa was applied, heat treatment was carried out for 20 seconds on a heating can of 200° C. to form a magnetic-recording medium. Then, this magnetic-recording medium was cut and incorporated into a cassette body to form a cassette tape.

The production condition of the base film is shown in Table 1, the dimensional changes of the base film and the magnetic-recording medium is shown in Table 2, and the estimation of the magnetic-recording medium is shown in Table 3 (the following examples and comparative examples are similar). The results of the estimation of the magnetic-recording medium were all within the range of practical use.

Examples 2-11

Films and magnetic tapes were produced in manners similar to that of Example 1 other than the conditions of stretching and heat treatment being changed as shown in Table 1 as compared with those of Example 1. The results of the estimations of the magnetic-recording media were all within the range of practical use.

Example 12

Film and magnetic tape were produced in a manner similar to that of Example 1 other than the conditions that the middle period temperature of the drying condition was changed to 100° C. and the drying time was changed to 3 minutes as compared with those of Example 1. The results of the estimation of the magnetic-recording medium were all good.

Example 13

Film and magnetic tape were produced in a manner similar to that of Example 1 other than the conditions that the middle period temperature of the drying condition was changed to 100° C., the drying time was changed to 3 minutes, the late period temperature was changed to 70° C. and the drying time of the late period was changed to 30 seconds as compared with those of Example 1. The results of the estimation of the magnetic-recording medium were all good.

Comparative Example 1

Film and magnetic tape were produced in a manner similar to that of Example 1 other than the condition that the re-stretching temperature in the transverse direction was changed to 260° C. as compared with that of Example 1. The curl recovering was insufficient, and the flatness of the magnetic tape could not be kept.

Comparative Example 2

Film and magnetic tape were produced in a manner similar to that of Example 1 other than the condition that the re-stretching temperature in the transverse direction was changed to 140° C. as compared with that of Example 1. The dimensional change deteriorated.

Comparative Example 3

Film and magnetic tape were produced in a manner similar to that of Example 1 other than the condition that the draw ratio for the re-stretching in the transverse direction was changed to 1.0 time as compared with that of Example 1. The curl recovering was insufficient, and the flatness of the magnetic tape could not be kept.

Comparative Example 4

Film and magnetic tape were produced in a manner similar to that of Example 1 other than the condition that the draw ratio for the re-stretching in the transverse direction was changed to 1.035 times as compared with that of Example 1. The heat shrinkage became large, and the dimensional change deteriorated.

Comparative Example 5

Film and magnetic tape were produced in a manner similar to that of Example 1 other than the condition that the time for heat setting was changed to 20 seconds as compared with that of Example 1. The dimensional change deteriorated.

Comparative Example 6

Film and magnetic tape were produced in a manner similar to that of Example 1 other than the condition that the temperature for heat setting was changed to 260° C. as compared with that of Example 1. The curl recovering was insufficient, and the flatness of the magnetic tape could not be kept.

Comparative Example 7

Film and magnetic tape were produced in a manner similar to that of Example 1 other than the condition that the temperature for heat setting was changed to 130° C. as compared with that of Example 1. The dimensional change deteriorated.

Comparative Example 8

Film and magnetic tape were produced in a manner similar to that of Example 1 other than the condition that the late period temperature was changed to 180° C. as compared with that of Example 1. The curl recovering and the dimensional change deteriorated.

Comparative Example 9

Film and magnetic tape were produced in a manner similar to that of Example 1 other than the conditions that the late period temperature was changed to 180° C. and the film forming was carried out by introducing the film into a water bath without bringing it into contact with a cooling roller after drying as compared with those of Example 1. The curl recovering was insufficient, and the flatness of the magnetic tape could not be kept.

TABLE 1

| | Polymer sheet | | | | | | Stretching condition | | | | | | | |
|---|---|---|---|---|---|---|---|---|---|---|---|---|---|---|
| | Condition for drying | | Temperature after delamination (° C.) | Temperature after cooling (° C.) | Water bath temperature (° C.) | MD stretching Draw ratio (times) | TD stretching | | TD restretching | | Heat setting | | |
| | Initial temperature (° C.) | Middle period temperature (° C.) | Late period temperature (° C.) | | | | | Temperature (° C.) | Draw ratio (times) | Temperature (° C.) | Draw ratio (times) | Temperature (° C.) | Draw ratio (times) | Time (second) |
| Example 1 | 100 | 180 | 100 | 120 | 60 | 50 | 1.15 | 280 | 1.44 | 200 | 1.015 | 150 | 1.000 | 45 |
| Example 2 | 100 | 180 | 100 | 120 | 60 | 50 | 1.15 | 280 | 1.44 | 200 | 1.015 | 150 | 1.000 | 30 |
| Example 3 | 100 | 180 | 100 | 120 | 60 | 50 | 1.15 | 280 | 1.44 | 200 | 1.015 | 180 | 1.000 | 45 |
| Example 4 | 100 | 180 | 100 | 120 | 60 | 50 | 1.15 | 280 | 1.44 | 240 | 1.015 | 150 | 1.000 | 45 |
| Example 5 | 100 | 180 | 100 | 120 | 60 | 50 | 1.15 | 280 | 1.44 | 160 | 1.015 | 150 | 1.000 | 45 |
| Example 6 | 100 | 180 | 100 | 120 | 60 | 50 | 1.15 | 280 | 1.44 | 200 | 1.025 | 150 | 1.000 | 45 |
| Example 7 | 100 | 180 | 100 | 120 | 60 | 50 | 1.20 | 280 | 1.35 | 200 | 1.030 | 150 | 1.000 | 60 |
| Example 8 | 100 | 180 | 100 | 120 | 60 | 50 | 1.35 | 250 | 1.40 | 240 | 1.015 | 180 | 1.000 | 90 |
| Example 9 | 100 | 180 | 100 | 120 | 60 | 50 | 1.35 | 250 | 1.20 | 220 | 1.015 | 150 | 1.000 | 45 |
| Example 10 | 100 | 180 | 100 | 120 | 60 | 50 | 1.15 | 280 | 2.00 | 240 | 1.010 | 150 | 1.000 | 45 |
| Example 11 | 100 | 180 | 100 | 120 | 60 | 50 | 1.80 | 250 | 1.10 | 200 | 1.030 | 150 | 1.000 | 45 |
| Example 12 | 100 | 100 | 100 | 100 | 60 | 50 | 1.15 | 280 | 1.44 | 200 | 1.015 | 150 | 1.000 | 45 |
| Example 13 | 100 | 100 | 70 | 80 | 60 | 50 | 1.15 | 280 | 1.44 | 200 | 1.015 | 150 | 1.000 | 45 |
| Comparative Example 1 | 100 | 180 | 100 | 120 | 60 | 50 | 1.15 | 280 | 1.44 | 260 | 1.015 | 150 | 1.000 | 45 |
| Comparative Example 2 | 100 | 180 | 100 | 120 | 60 | 50 | 1.15 | 280 | 1.44 | 140 | 1.015 | 150 | 1.000 | 45 |
| Comparative Example 3 | 100 | 180 | 100 | 120 | 60 | 50 | 1.15 | 280 | 1.44 | 200 | 1.000 | 150 | 1.000 | 45 |
| Comparative Example 4 | 100 | 180 | 100 | 120 | 60 | 50 | 1.15 | 280 | 1.44 | 200 | 1.035 | 150 | 1.000 | 45 |
| Comparative Example 5 | 100 | 180 | 100 | 120 | 60 | 50 | 1.15 | 280 | 1.44 | 200 | 1.015 | 150 | 1.000 | 20 |
| Comparative Example 6 | 100 | 180 | 100 | 120 | 60 | 50 | 1.15 | 280 | 1.44 | 200 | 1.015 | 260 | 1.000 | 45 |
| Comparative Example 7 | 100 | 180 | 100 | 120 | 60 | 50 | 1.15 | 280 | 1.44 | 200 | 1.015 | 130 | 1.000 | 45 |

TABLE 1-continued

| | Polymer sheet | | | | | | Stretching condition | | | | | | |
|---|---|---|---|---|---|---|---|---|---|---|---|---|---|
| | Condition for drying | | Temperature after delamination (°C.) | Temperature after cooling (°C.) | Water bath temperature (°C.) | MD stretching Draw ratio (times) | TD stretching | | TD restretching | | Heat setting | | |
| | Initial temperature (°C.) | Middle period temperature (°C.) | Late period temperature (°C.) | | | | | Temperature (°C.) | Draw ratio (times) | Temperature (°C.) | Draw ratio (times) | Temperature (°C.) | Draw ratio (times) | Time (second) |
| Comparative Example 8 | 100 | 180 | 180 | 170 | 100 | 50 | 1.15 | 280 | 1.44 | 200 | 1.015 | 150 | 1.000 | 45 |
| Comparative Example 9 | 100 | 180 | 180 | 170 | 160 | 50 | 1.15 | 280 | 1.44 | 200 | 1.015 | 150 | 1.000 | 45 |

MD: longitudinal direction,
TD: transverse direction

TABLE 2

| | Base film | | | | | | | | | Magnetic tape | | | |
|---|---|---|---|---|---|---|---|---|---|---|---|---|---|
| | Young's modulus E (GPa) | | | Heat shrinkage (%) | | Coefficient of thermal expansion $\alpha$ ($\times 10^{-6}$/°C.) | | Coefficient of hygroscopic expansion $\beta$ ($\times 10^{-6}$/% RH) | | Coefficient of thermal expansion $\alpha'$ ($\times 10^{-6}$/°C.) | | Coefficient of hygroscopic expansion $\beta'$ ($\times 10^{-6}$/% RH) | |
| | MD | TD | $E_{TD}/E_{MD}$ | MD | TD | MD | TD | MD | TD | MD | TD | MD | TD |
| Example 1 | 11 | 15 | 1.36 | 0.9 | 1.7 | −3 | −6 | 6 | −2 | −3 | −1 | 6 | 4 |
| Example 2 | 11 | 15 | 1.36 | 0.9 | 1.7 | −3 | −6 | 6 | −2 | −3 | −3 | 6 | 2 |
| Example 3 | 11 | 15 | 1.36 | 0.9 | 1.7 | −3 | −6 | 6 | −2 | −3 | −2 | 6 | 3 |
| Example 4 | 11 | 15 | 1.36 | 1.0 | 1.5 | −2 | −5 | 6 | 0 | −2 | −3 | 6 | 4 |
| Example 5 | 11 | 15 | 1.36 | 0.9 | 2.1 | −3 | −9 | 6 | −3 | −2 | −2 | 6 | 3 |
| Example 6 | 11 | 15 | 1.36 | 0.8 | 1.9 | −3 | −8 | 6 | −4 | −3 | −2 | 6 | 4 |
| Example 7 | 13 | 13 | 1.00 | 1.0 | 1.5 | −3 | −7 | 3 | −6 | −1 | −4 | 3 | 1 |
| Example 8 | 15 | 13 | 0.87 | 0.9 | 1.5 | −2 | −5 | 1 | −3 | −3 | 1 | 2 | 3 |
| Example 9 | 16 | 11 | 0.69 | 1.2 | 1.5 | −5 | −8 | 3 | −7 | −3 | −1 | 3 | −1 |
| Example 10 | 10 | 18 | 1.80 | 0.3 | 2.2 | 6 | −2 | 7 | −2 | −5 | −5 | 7 | 6 |
| Example 11 | 20 | 7 | 0.35 | 1.5 | 1.6 | −7 | −11 | 1 | −1 | −6 | −4 | 1 | 5 |
| Example 12 | 11 | 15 | 1.36 | 0.9 | 1.8 | −3 | −5 | 5 | −2 | −3 | −1 | 5 | 3 |
| Example 13 | 11 | 15 | 1.36 | 0.8 | 1.7 | −3 | −5 | 4 | −2 | −3 | −2 | 4 | 3 |
| Comparative Example 1 | 11 | 15 | 1.36 | 0.9 | 0.7 | −3 | −3 | 6 | 4 | — | — | — | — |
| Comparative Example 2 | 11 | 15 | 1.36 | 0.7 | 2.6 | 1 | −10 | 5 | −4 | 2 | −4 | 8 | 1 |
| Comparative Example 3 | 11 | 15 | 1.36 | 0.7 | 0.5 | −3 | −1 | 6 | 6 | — | — | — | — |
| Comparative Example 4 | 11 | 15 | 1.36 | 0.5 | 2.7 | −3 | −12 | 6 | −5 | −3 | −6 | 6 | 0 |
| Comparative Example 5 | 11 | 15 | 1.36 | 0.9 | 1.5 | −3 | 0 | 6 | 4 | −3 | 5 | 6 | 12 |
| Comparative Example 6 | 11 | 15 | 1.36 | 0.8 | 0.7 | −3 | −5 | 5 | 1 | — | — | — | — |
| Comparative Example 7 | 11 | 15 | 1.36 | 0.9 | 1.5 | −3 | −2 | 5 | 3 | −3 | 4 | 5 | 10 |
| Comparative Example 8 | 13 | 13 | 1.00 | 1.2 | 1.4 | −4 | −3 | 8 | 3 | −4 | 0 | 8 | 7 |
| Comparative Example 9 | 15 | 9 | 0.60 | 1.5 | 0.8 | −1 | 2 | 9 | 6 | — | — | — | — |

MD: longitudinal direction,
TD: transverse direction

TABLE 3

| | Curl recovering | Displacement (%) | | | | | | | | | Deformation | | |
|---|---|---|---|---|---|---|---|---|---|---|---|---|---|
| | | Condition 1 | | | Condition 2 | | | Condition 3 | | | Estimation | of end portion | Running durability |
| | | MD | TD | Difference | MD | TD | Difference | MD | TD | Difference | | | |
| Example 1 | ○ | 0.034 | 0.022 | 0.012 | 0.001 | 0.002 | 0.001 | 0.049 | 0.032 | 0.017 | ○ | ○ | ○ |
| Example 2 | ○ | 0.039 | 0.015 | 0.024 | 0.001 | 0.007 | 0.006 | 0.043 | 0.027 | 0.016 | Δ | ○ | ○ |
| Example 3 | ○ | 0.025 | 0.015 | 0.010 | 0.002 | 0.002 | 0.000 | 0.059 | 0.034 | 0.025 | Δ | ○ | ○ |
| Example 4 | ○ | 0.035 | 0.016 | 0.019 | 0.009 | 0.007 | 0.002 | 0.039 | 0.038 | 0.001 | ○ | ○ | ○ |
| Example 5 | ○ | 0.036 | 0.019 | 0.017 | 0.001 | 0.002 | 0.001 | 0.047 | 0.022 | 0.025 | Δ | ○ | ○ |
| Example 6 | ○ | 0.034 | 0.022 | 0.012 | 0.002 | 0.001 | 0.001 | 0.049 | 0.035 | 0.014 | ○ | ○ | ○ |
| Example 7 | ○ | 0.019 | 0.013 | 0.006 | 0.001 | 0.017 | 0.016 | 0.023 | 0.004 | 0.019 | ○ | ○ | ○ |
| Example 8 | ○ | 0.013 | 0.023 | 0.010 | 0.008 | 0.005 | 0.003 | 0.027 | 0.016 | 0.009 | ○ | ○ | ○ |
| Example 9 | ○ | 0.017 | 0.002 | 0.015 | 0.006 | 0.004 | 0.002 | 0.042 | 0.014 | 0.028 | Δ | ○ | Δ |
| Example 10 | ○ | 0.055 | 0.042 | 0.010 | 0.025 | 0.025 | 0.000 | 0.033 | 0.023 | 0.010 | ○ | Δ | ○ |
| Example 11 | ○ | 0.004 | 0.029 | 0.025 | 0.012 | 0.003 | 0.009 | 0.021 | 0.042 | 0.021 | Δ | ○ | Δ |
| Example 12 | ○ | 0.028 | 0.019 | 0.009 | 0.004 | 0.002 | 0.002 | 0.046 | 0.027 | 0.019 | ○ | ○ | ○ |
| Example 13 | ○ | 0.022 | 0.017 | 0.005 | 0.005 | 0.003 | 0.002 | 0.039 | 0.028 | 0.011 | ○ | ○ | ○ |
| Comparative Example 1 | X | — | — | — | — | — | — | — | — | — | — | — | — |
| Comparative Example 2 | ○ | 0.072 | 0.005 | 0.067 | 0.022 | 0.011 | 0.011 | 0.046 | 0.018 | 0.028 | X | ○ | ○ |
| Comparative Example 3 | X | — | — | — | — | — | — | — | — | — | — | — | — |
| Comparative Example 4 | ○ | 0.035 | 0.013 | 0.022 | 0.007 | 0.026 | 0.019 | 0.064 | 0.019 | 0.045 | X | ○ | ○ |
| Comparative Example 5 | ○ | 0.034 | 0.097 | 0.063 | 0.002 | 0.036 | 0.034 | 0.059 | 0.077 | 0.018 | X | ○ | ○ |
| Comparative Example 6 | X | — | — | — | — | — | — | — | — | — | — | — | — |
| Comparative Example 7 | ○ | 0.034 | 0.087 | 0.053 | 0.006 | 0.035 | 0.029 | 0.057 | 0.071 | 0.014 | X | ○ | ○ |
| Comparative Example 8 | Δ | 0.048 | 0.049 | 0.001 | 0.003 | 0.010 | 0.007 | 0.071 | 0.049 | 0.022 | X | ○ | Δ |
| Comparative Example 9 | X | — | — | — | — | — | — | — | — | — | — | — | — |

MD: longitudinal direction,
TD: transverse direction

INDUSTRIAL APPLICATIONS OF THE INVENTION

The film according to the present invention can be used as a base film for a magnetic-recording medium such as a magnetic tape for preserving data of a computer. In particular, it can be suitably applied to use for high-density recording from the viewpoint of its excellent dimensional stability, but the application is not limited thereto.

The invention claimed is:

1. A magnetic recording medium comprising a magnetic layer on at least one surface of a film formed from an aromatic polyamide, the film being characterized in that the heat shrinkage ratio in the transverse direction of the film subjected to heat treatment under a condition of no tension for 30 mm. at 180° C. is from 1.0 to 2.5%, and wherein the film:

(1) satisfies the following equations (1)-(4) simultaneously, with $\alpha MD$ ($\times 10^{-6}/°$ C.) and $\alpha TD$ ($\times 10^{-6}/°$ C.) being coefficient of thermal expansion in the longitudinal and the transverse direction, respectively, and $\beta MD$ ($\times 10^{-6}/\%$ RH) and $\beta TD$ ($\times 10^{-6}/\%$ RH) being coefficient of hygroscopic expansion in the longitudinal and the transverse direction, respectively, $$-7 \leq \alpha MD \leq 6 \tag{1}$$

$$\alpha MD - 10 \leq \alpha TD \leq \alpha MD - 3 \tag{2}$$

$$-10 \leq \beta MD \leq 10 \tag{3}$$

$$\beta MD - 10 \leq \beta TD \leq \beta MD - 3 \tag{4); and}$$

(2) satisfies the following equations (5) and (6) simultaneously, with EMD (GPa) and ETD (GPa) being Young's moduli in the longitudinal and the transverse direction, respectively, $$8 \leq EMD \leq 16 \tag{5}$$

$$EMD \times 0.7 \leq ETD \leq EMD \times 1.7 \tag{6);}$$

and wherein the magnetic-recording medium satisfies the following equations (7)-(10) simultaneously, with $\alpha'MD$ ($\times 10^{-6}/°$ C.) and $\alpha'TD$ ($\times 10^{-6}/°$ C.) being coefficients of thermal expansion in the longitudinal and the transverse directions, respectively, and $\beta'MD$ ($\times 10^{-6}/\%$ RH) and $\beta'TD$ ($\times 10^{-6}/\%$ RH) being coefficients of hygroscopic expansion in the longitudinal and the transverse directions, respectively, $$-5 \leq \alpha'MD \leq 10 \tag{7}$$

$$-5 \leq \alpha'MD - \alpha'TD \leq 5 \tag{8}$$

$$-10 \leq \beta'MD \leq 7 \tag{9}$$

$$-5 \leq \beta'MD - \beta'TD \leq 5 \tag{10).}$$

* * * * *